United States Patent
Wang et al.

(10) Patent No.: US 8,633,441 B2
(45) Date of Patent: Jan. 21, 2014

(54) DIE BONDING PROCESS INCORPORATING INFRARED VISION SYSTEM

(75) Inventors: Ran Shi Wang, Kwai Chung (HK); Wing Hong Leung, Kwai Chung (HK); Siu Wing Lau, Kwai Chung (HK)

(73) Assignee: ASM Assembly Automation Ltd, Hong Kong (HK)

( * ) Notice: Subject to any disclaimer, the term of this patent is extended or adjusted under 35 U.S.C. 154(b) by 637 days.

(21) Appl. No.: 12/552,520

(22) Filed: Sep. 2, 2009

(65) Prior Publication Data

US 2011/0051124 A1    Mar. 3, 2011

(51) Int. Cl.
*G01N 21/35* (2006.01)

(52) U.S. Cl.
USPC .................... 250/339.06; 250/339.09

(58) Field of Classification Search
USPC ............... 250/339.06, 339.09; 257/737, 774; 356/400; 438/118
See application file for complete search history.

(56) References Cited

U.S. PATENT DOCUMENTS

| | | | | |
|---|---|---|---|---|
| 3,645,622 | A * | 2/1972 | Cachon et al. | 355/132 |
| 6,229,595 | B1 * | 5/2001 | McKinley et al. | 355/53 |
| 6,321,971 | B1 | 11/2001 | Jin et al. | |
| 6,525,805 | B2 * | 2/2003 | Heinle | 355/53 |
| 7,751,067 | B1 * | 7/2010 | True et al. | 356/614 |
| 2004/0167640 | A1 * | 8/2004 | Knappe et al. | 700/57 |
| 2005/0006606 | A1 * | 1/2005 | Wang et al. | 250/559.4 |
| 2007/0134904 | A1 | 6/2007 | Wan et al. | |

FOREIGN PATENT DOCUMENTS

JP          04199525 A * 7/1992

* cited by examiner

*Primary Examiner* — Casey Bryant
(74) *Attorney, Agent, or Firm* — Ostrolenk Faber LLP

(57) ABSTRACT

A method of aligning a die when the die is held with a circuit pattern on a first side of the die facing away from an infrared light source, wherein infrared light from the infrared light source is projected onto a second side of the die opposite to the first side such that the infrared light passes through a body of the die. From the second side of the die, an image of the infrared light reflected from the circuit pattern is detected and captured. Thereafter, an alignment of the die from the captured image of the die is determined.

10 Claims, 7 Drawing Sheets

DIE BONDING PROCESS INCORPORATING INFRARED VISION SYSTEM

FIELD OF THE INVENTION

The invention relates to the attachment of a semiconductor die onto a mounting surface, and in particular to pre-bonding die alignment and post-bonding die inspection.

BACKGROUND AND PRIOR ART

Typically, in a die bonding process, each die is picked up by a pick head of a die bonder from a wafer and then transported to a substrate where it is bonded onto the substrate. In order to place the die correctly and accurately onto the substrate, visual alignment is performed to capture images of the die on the wafer platform and of the substrate respectively. A die bonder usually incorporates a first optical system to capture an image of the die before the bond head is moved into position to pick up the die while a second optical system captures an image of the die bonding site on the substrate. The orientation of the die is adjusted based upon the image taken of the die bonding site, before the die is placed onto the substrate. A problem with this approach is that motion error may unintentionally result during the die pick-up process after the image of the die has been captured. This error cannot be corrected or compensated for by the vision system. Moreover, when a die is lifted from an adhesive Mylar paper on which it is mounted, an unexpected die offset or rotation relative to the pick head may arise when the die leaves the film surface.

US Patent Publication No. 2007/0134904 A1 entitled "High Precision Die Bonding Apparatus" discloses a method to reduce motion error by determining the position and orientation of the die only after it has been picked up from the wafer platform. The orientation of a die being held by a pick-up tool between an optical assembly and a die bonding site is viewable by the optical assembly so as to align the orientation of the die with the orientation of the die bonding site before the die is bonded to the substrate. Thus, motion error due to the pick up process of the die is avoided. However in this prior art, the type of dice which can be aligned using this method is limited to long dice, and the viewable areas of the die are limited to the boundary of the die, especially the corners of the die as the view of the center of the die is blocked by the pick-up tool. Furthermore, the die must have fiducial marks at the corners for alignment.

FIG. 1 is a schematic illustration of a conventional method of visually aligning a die 102 with a bonding site on a bonding substrate 104 to rectify motion error after picking up the die 102. In the die bonding process, a first alignment optical system 106 captures an image of the die 102 located on a wafer platform 108 before the die 102 is picked up by a pick head 110. The image of the circuit pattern which resides on the top side of the die 102 is captured. The die 102 is next aligned using a boundary of the die from the bottom side of the die 102 by a second alignment optical system 112. Thereafter, the alignment of the die 102 may be further adjusted after imaging the bonding site with a third alignment optical system 114 located over a bonding site at the bonding substrate 104 by aligning the die relative to the bonding substrate 104. This method of alignment however requires complex calibration of the die pattern and the die boundary. Furthermore, it may be unreliable to conduct alignment based on the die boundary since accuracy of the alignment based on the boundary of a die alone is subject to the sawing quality of the die and the conditions of the bottom side of the die. When the edge is not sufficiently straight due to poor cutting of the die, the boundary of the die would not be accurately defined for accurate alignment.

FIG. 2 shows a schematic illustration of another conventional method of visually aligning the die 102 with a bonding site on a bonding substrate 104 to rectify and reduce motion error after picking up the die 102 by using an intermediate stage 116. After the die 102 has been picked up by the pick head 110, the die 102 is placed on the intermediate stage 116 and it is imaged by an intermediate alignment optical system 118. The circuit pattern on the top side of the die 102 is viewable and is imaged for aligning the die 102. Next, the die 102 is picked up again and placed on a bonding site on the bonding substrate 104 after the die position relative to the bonding substrate 104 has been aligned by the third alignment optical system 114. The process of picking up the die 102 from the alignment or intermediate stage 116 should introduce less positional error than when the die 102 is picked up directly from a wafer platform 108 since the orientation of the die 102 when it is on the alignment or intermediate stage 116 can be imaged again for alignment before it is picked up for die bonding and the adhesion effect of the Mylar paper in the pick-up process is avoided in this approach. Hence, the positional error is reduced.

However, this method of aligning a die requires an additional operation which makes the machine more complicated and reduces the machine throughput speed. Though error due to the adhesion force of Mylar paper is avoided, this prior art still encounters positional errors from the pick up operation of the die from the intermediate stage 116. An example of a prior art which uses an intermediate or an alignment stage is U.S. Pat. No. 6,321,971 entitled "Die Collet For A Semiconductor Chip And Apparatus For Bonding Semiconductor Chip To A Lead Frame".

In another bonding application, inspection is commonly carried out for checking the accuracy and quality of flip-chip bonding. FIG. 3 is a schematic illustration of a conventional inspection method for inspection of placement accuracy of a flip-chip 102'. The flip-chip 102' has been transferred from a wafer platform 108 to a bond site on the bonding substrate 104 where bumps 120 on the underside of the flip-chip 102' are bonded to bond pads 122. The third alignment optical system 114 may be deployed to capture the image of the flip-chip 102' and align the boundary of the flip-chip 102' with the bonding substrate 104 for checking the accuracy and quality of bonding. This method of checking bonding accuracy using the boundary of the flip-chip 102' is however not accurate since the alignment of the circuit pattern rather than the boundary of the flip-chip is of interest. The relationship between the die boundary and the circuit pattern may also not be straightforward. Additionally, the die boundary may not be well-defined due to poor sawing quality which results in uneven edges. Rough edges or cracks along the edge may also give unreliable results if one checks alignment using the die boundary.

Further, post-bond inspection may entail checking epoxy adhesive such as silver epoxy under an integrated circuit die and under-fill glue beneath a flip-chip. However, the epoxy adhesive or the under-fill glue is not viewable using a conventional optical system. Generally, the adhesive and the under-fill are checked by off-line X-ray equipment or by ultrasonic imaging equipment. Furthermore, post-bond inspection of flip-chip bonding on the degree of displacement of the circuit pattern (for example, displacement of metal traces and bond pads) with respect to the bonding substrate is not feasible as the die is flipped. The die position can only be estimated from the die boundary. It is therefore advantageous to make available an on-line post-bond checking method for the coverage of under-fill glue or silver epoxy adhesive under the die as well as the circuit pattern of a bonded flip-chip, where such post-bond checking may be performed on the same machine or on a different machine. It would also be desirable to perform visual alignment of a die after it has been picked by the pick head and before it is placed onto a bonding substrate to avoid the aforesaid motion error and adhesion error introduced when the die is being picked up.

SUMMARY OF THE INVENTION

It is therefore an object of the invention to seek to provide an improved method for pre-bond alignment of an integrated circuit die or a flip-chip with a bonding site as well as for conducting post-bond inspection.

According to a first aspect of the invention, there is provided a method of aligning a die, comprising the steps of: holding the die with a circuit pattern on a first side of the die facing away from an infrared light source; projecting infrared light from the infrared light source onto a second side of the die opposite to the first side such that the infrared light passes through a body of the die; from the second side of the die, detecting and capturing an image of the infrared light reflected from the circuit pattern; and thereafter determining an alignment of the die from the captured image of the infrared light reflected from the circuit pattern.

According to a second aspect of the invention, there is provided a method for inspecting an alignment of a die relative to a substrate onto which it is placed, comprising the steps of: positioning the die such that a first side of the die which has a circuit pattern formed on it is facing away from an infrared light source; projecting infrared light from the infrared light source onto a second side of the die opposite to the first side such that the infrared light passes through a body of the die; from the second side of the die, detecting and capturing an image of the infrared light reflected from the circuit pattern; and thereafter determining an alignment of the die from the captured image and comparing it with an alignment of the substrate on which the die is placed.

According to a third aspect of the invention, there is provided a method of inspecting coverage of a material on which a first side of a die is in contact with after the first side of the die has been bonded to a substrate, comprising the steps of: positioning the die with the first side of the die facing away from an infrared light source; projecting infrared light from the infrared light source onto a second side of the die opposite to the first side such that the infrared light passes through a body of the die; from the second side of the die, detecting and capturing an image of the infrared light having an image contrast between the material and any void in the material; and determining an extent of coverage of the material onto the first side of the die from the image captured.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

The present invention will be readily appreciated by reference to the detailed description of a preferred embodiment of the invention when considered with the accompanying drawings, in which.

DETAILED DESCRIPTION OF THE PREFERRED EMBODIMENT OF THE INVENTION

Figure 1:
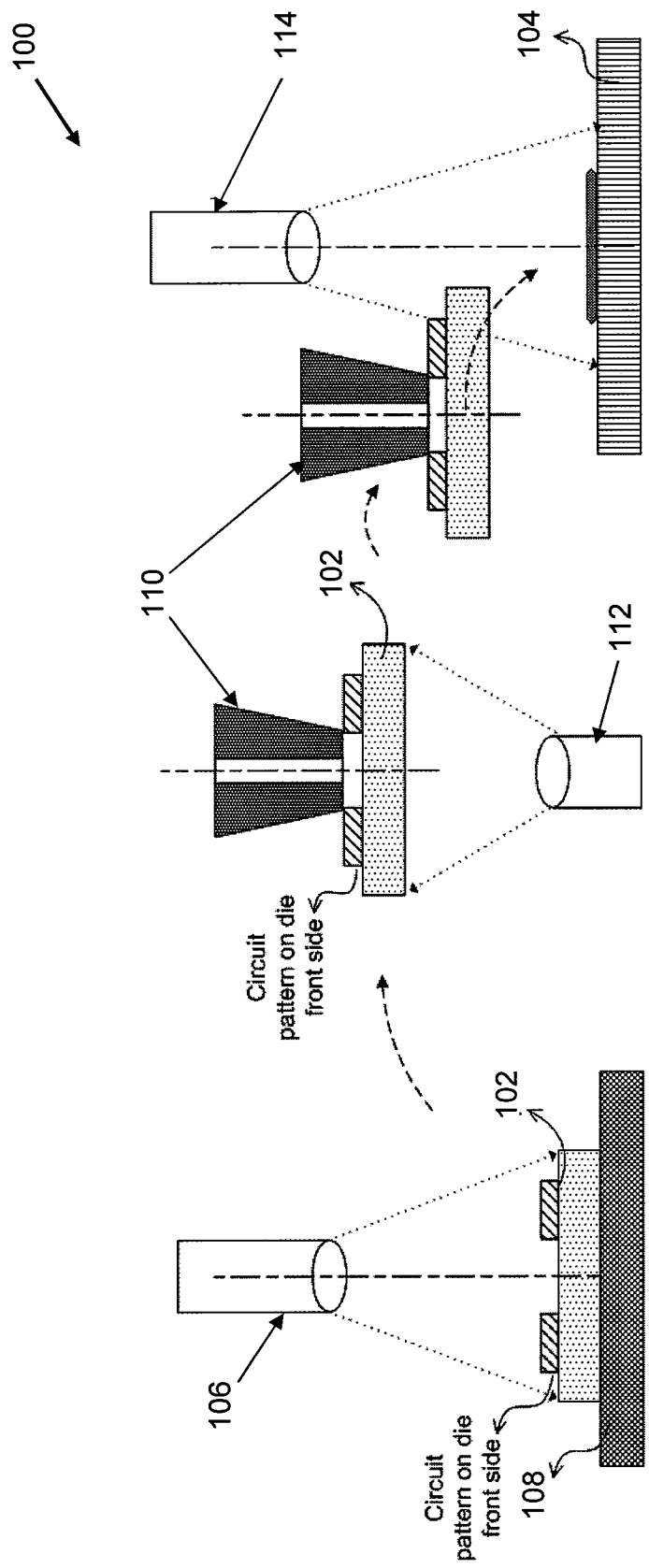
FIG. 1 is a schematic illustration of a conventional method of visually aligning a die with a bonding site on a bonding substrate to rectify motion error after picking up the die.
Figure 2:
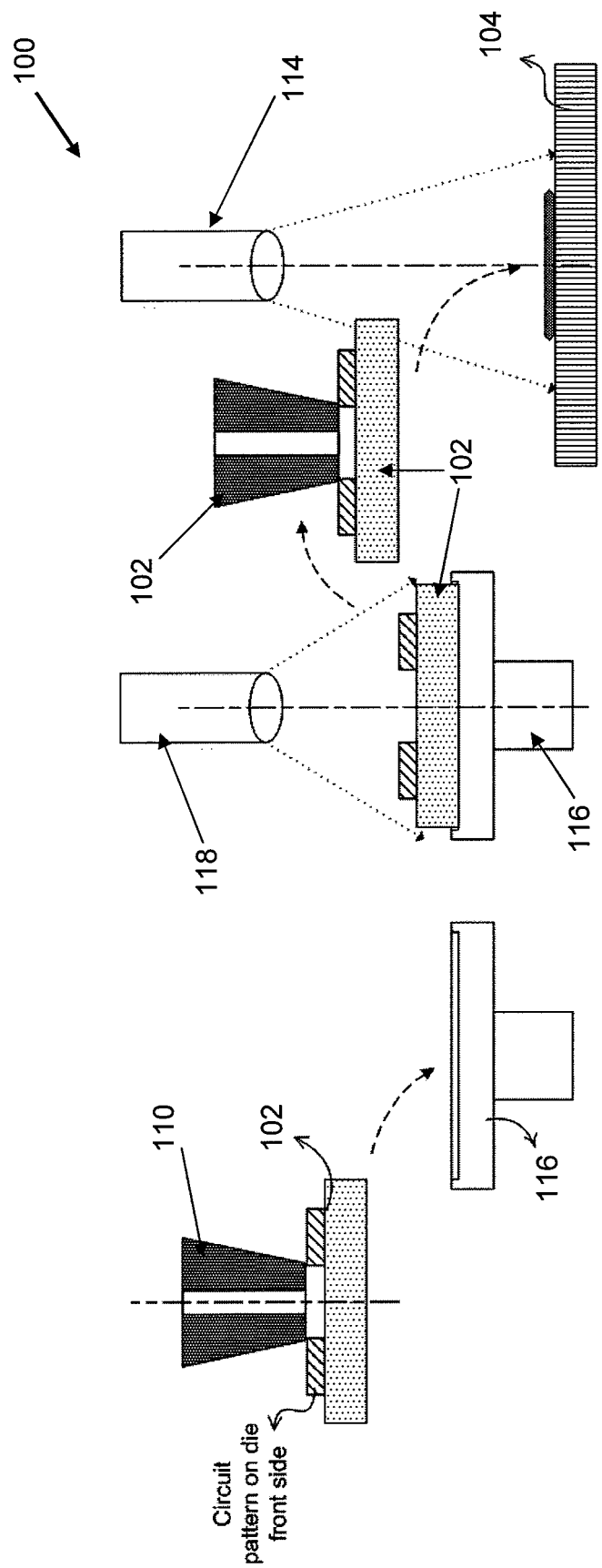
FIG. 2 shows a schematic illustration of another conventional method of visually aligning the die with a bonding site on a bonding substrate to rectify and reduce motion error after picking up the die by using an intermediate stage.
Figure 3:
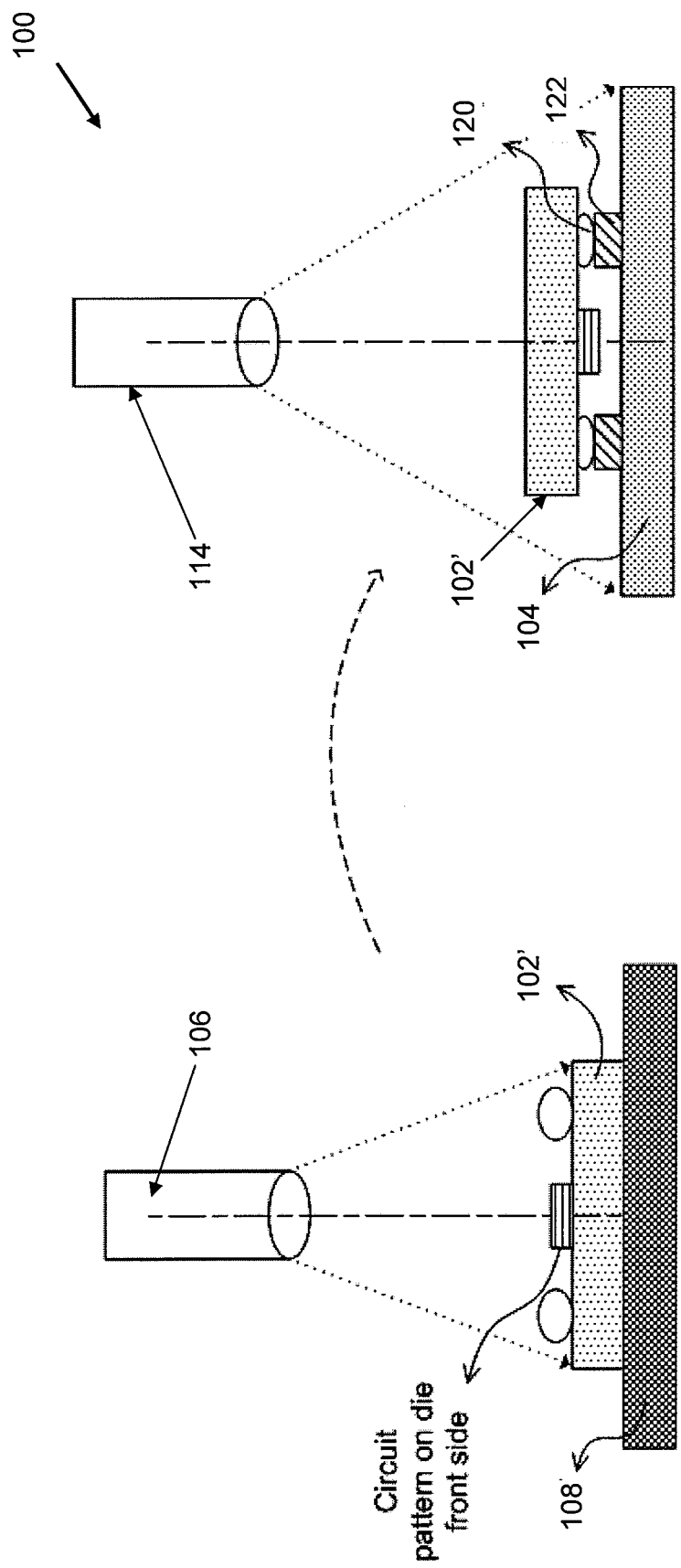
FIG. 3 is a schematic illustration of a conventional inspection method for inspection of placement accuracy of a flip-chip.
Figure 4:
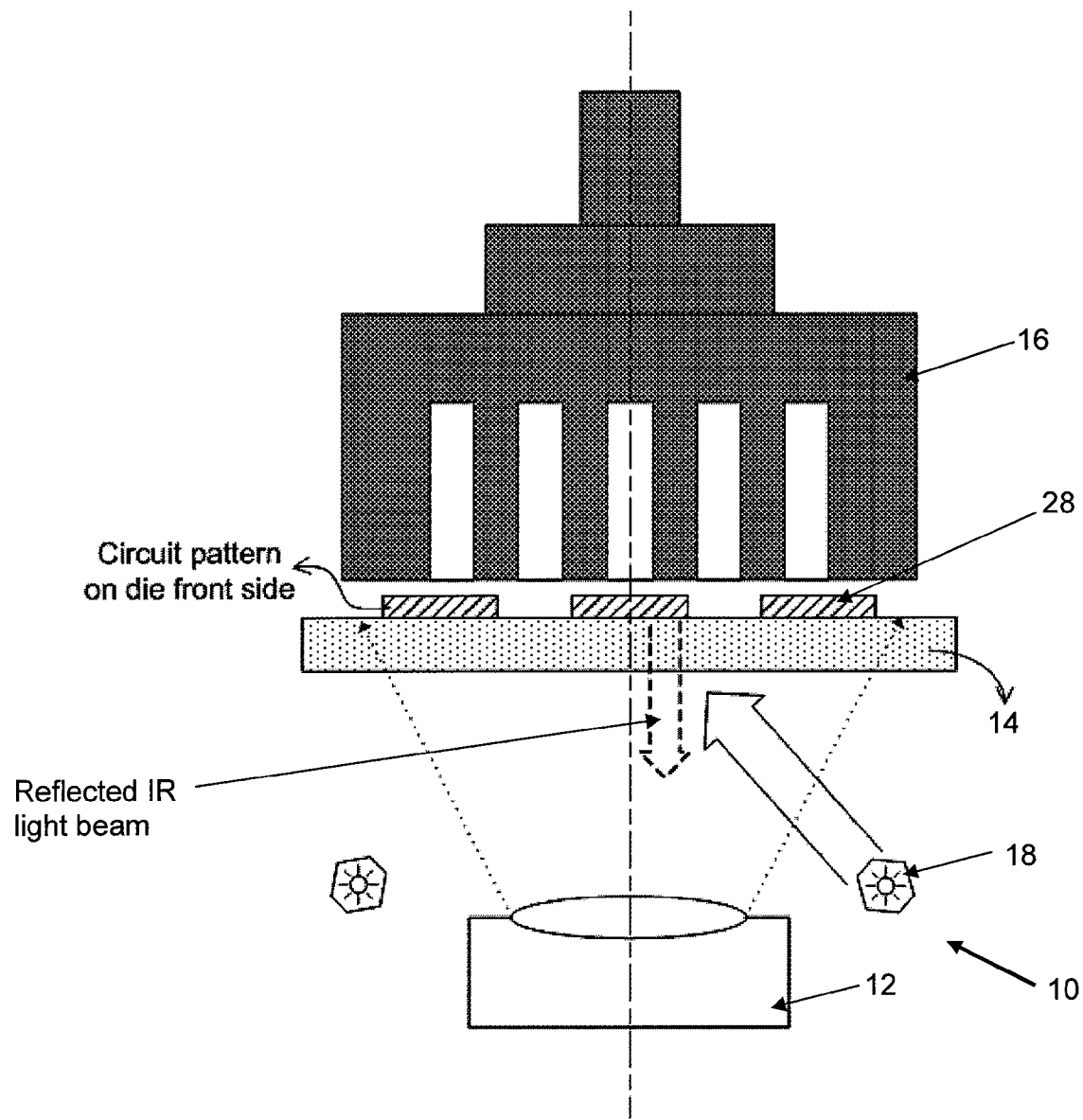
FIG. 4 is a schematic view of a first optical system of an infrared vision system of a die bonding apparatus for pre-bond alignment of a die according to the preferred embodiment of the invention.

FIG. 4 is a schematic view of a first optical system 12 of an infrared vision system 10 of a die bonding apparatus for pre-bond alignment of a die 14 according to the preferred embodiment of the invention. The die 14 is picked up and held by a vacuum suction holding force generated by a pick head 16. The pick head 16 contacts a first or front side of the die 14 on which a circuit pattern 28 is located such that the circuit pattern 28 is at least partially covered by the pick head 16.

The first or top side of the die 14 faces away from the infrared vision system 10, which comprises the first optical system 12 and an infrared (IR) light source 18. An inclined beam of IR light with a wavelength of about 800 nm to 1600 nm from the IR light source 18 is used to illuminate the die 14 from a second or bottom side of the die 14 opposite to the first or front side, which is not covered by any metallic material or coating which may block penetration of the IR light. Although the circuit pattern 28 on the first side of the die 14 is not exposed to the IR light beam directly, the die 14 is usually made of silicon which is at least partially transparent to the IR light beam thus permitting IR light to pass through the body of the die 14, although the body of the die 14 is opaque to visible light. On the other hand, the metallic circuit pattern 28 of the die 14 is not transparent to IR light and reflects IR light. From the second side of the die 14, the first optical system 12 located below the pick head 16 detects and captures an image of the IR light which is reflected by the circuit pattern 28. The die 14 may thus be aligned by using the captured image formed after comparing the image of the metallic circuit pattern 28 on the die 14 with a desired alignment of the die 14 before bonding the die to a substrate 15. Reflected light from the first air-silicon surface may tend to reduce the image contrast. To avoid capturing this reflected light, the incident beam of IR light is projected at an angle which is oblique to the second side of the die 14 as shown in FIG. 4. Further, the pick head 16 is usually made of material that is non-reflective to IR light so as not to reflect light which may reduce the image quality.

Figure 5:
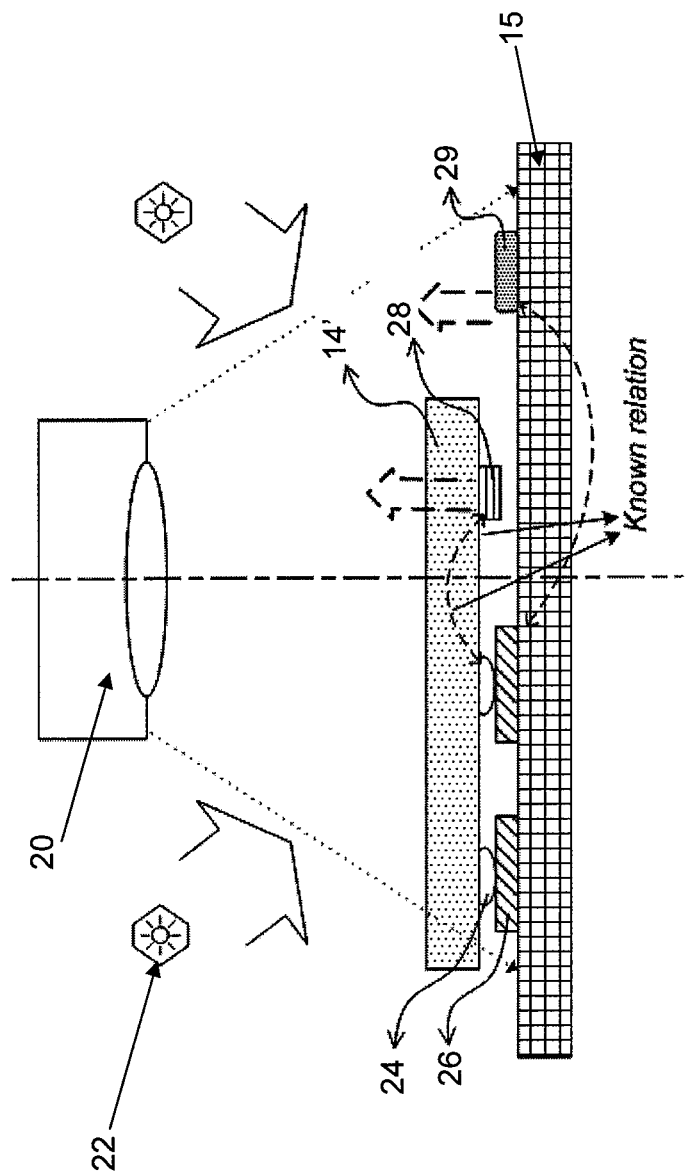
FIG. 5 is a schematic view of a second optical system of the infrared vision system of FIG. 4 for post-placement inspection during flip-chip bonding according to the preferred embodiment of the invention.

FIG. 5 is a schematic view of a second optical system 20 of the infrared vision system 10 of FIG. 4 for post-placement inspection during flip-chip bonding according to the preferred embodiment of the invention. Post-placement inspection is useful for checking the accuracy of flip-chip bonding or the alignment of a flip-chip 14' relative to a substrate 15. Inspection is conducted after a flip-chip 14' has been placed onto a bonding substrate 15 for making an interconnection between solder bumps 24 on a first side of the flip-chip 14' to bond pads 26 on the bonding substrate 15. Accuracy of bonding is determined by checking the alignment between predetermined patterns which are buried on the first side of the flip-chip 14' relative to predetermined patterns found on the substrate 15. Conventional optical systems are unable to illuminate the predetermined patterns which reside on the underside of the flip-chip 14' and they are not viewable by the conventional optical system.

The flip-chip 14' is positioned with the first side of the flip-chip 14', which has a predetermined pattern such as a circuit pattern 28 formed on it, facing away from the second optical system 20. The IR lighting 22 of the second optical system 20 is projected onto the second side of the flip-chip 14' opposite to the first side which is not covered by a circuit pattern or metallic material such that the IR light passes through the body of the flip-chip 14' to illuminate the circuit pattern 28 beneath the flip-chip 14'. The IR light is projected at an angle which is oblique to the second side of the flip chip 14' so as to reduce interference from reflection off the second side of the flip-chip 14'. The second optical system 20 is located above the second side of the flip-chip 14' and detects and captures an image of the IR light reflected from the circuit pattern 28 on the first side thereof. Images of light reflected from predetermined patterns on the substrate 15 such as exposed markings 29 of the substrate 15 may be simultaneously or separately captured by detecting and capturing the reflected light.

The alignment of the flip-chip 14' relative to the substrate 15 may then be determined from the captured images. The position of the circuit pattern 28 relative to the exposed markings 29 on the substrate 15 can be aligned by the captured images. This involves the step of calculating the alignment of the predetermined patterns (such as solder bumps 24) on the flip chip 14' relative to predetermined patterns on the substrate 15 (such as bond pads 26 and exposed markings 29) from a predetermined relationship between the respective patterns. In the above example, the position correlation between the solder bumps 24 and the circuit pattern 28, as well as between the bond pads 26 and the exposed markings 29 of the substrate 15 are thus known or can be pre-calibrated. Any offset or displacement between the solder bumps 24 of the die 14' and the bond pads 26 on the substrate 15 can be calculated.

Figure 6:
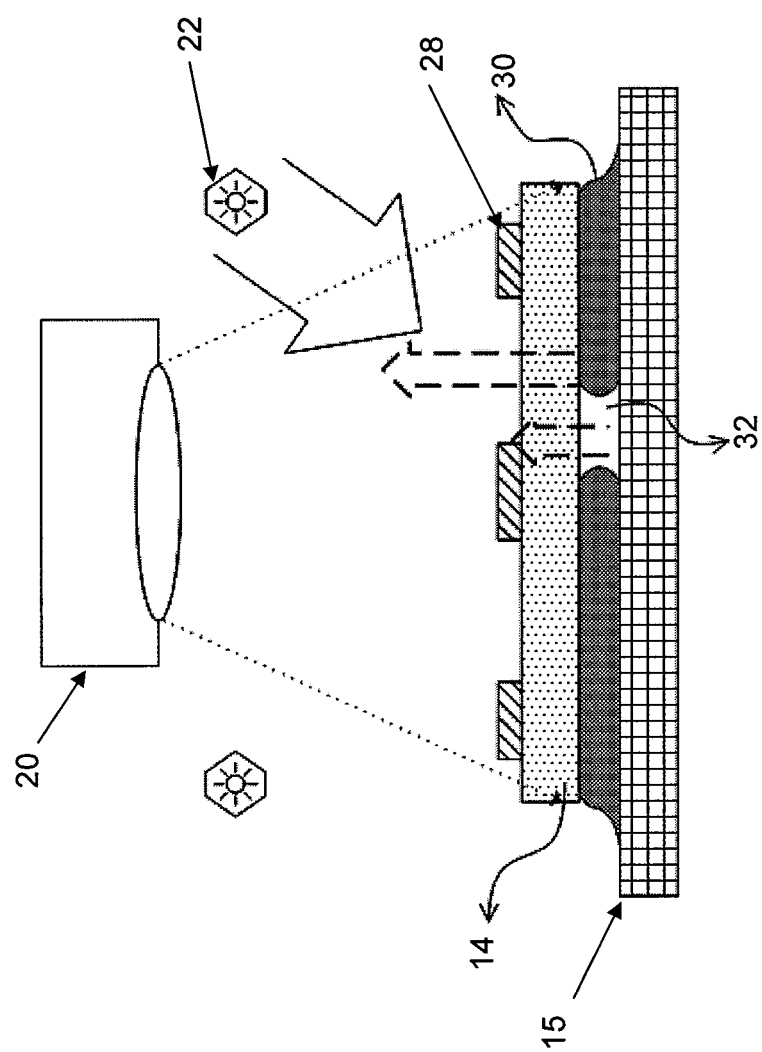
FIG. 6 is a schematic view of the second optical system of FIG. 5 illustrating post-bond inspection of the coverage of a silver epoxy adhesive under a bonded integrated circuit die.

FIG. 6 is a schematic view of the second optical system 20 of FIG. 5 illustrating post-bond inspection of the coverage of a silver epoxy 30 adhesive under a bonded integrated circuit die 14. The die 14 is positioned with a first side facing away from the inclined IR lighting 22 which is located above the die 14 for illuminating the die 14 from a second side of the die 14 opposite to the first side such that the IR light passes through the body of the die 14. Test dice are generally used in a bonding test for setting up the machine or for adjusting its parameters. The covering ratio of the circuit pattern 28 on the surface of the test die 14 is relatively low, such as less than 5%, so most of the IR light passes through the die 14. The silver epoxy 30 adhesive below the die 14 is made of material that is not transparent to IR light and reflects the IR light. When there is a void 32 with no silver epoxy 30, the IR light would reach the bonding substrate 15 such as a PCB or a lead frame, and be reflected. The IR light reflected from the surface of the silver epoxy 30 and the bonding substrate 15 are of different light intensities in the captured image due to the different material properties of the bonding substrate 15 and the silver epoxy 30. An image contrast resulting from different light intensities may be detected and captured by the second optical system 20 from the second side of the die 14. The locations and sizes of voids 32 which are present at the underside or first side of the die 14 can be determined from the captured images.

Figure 7:
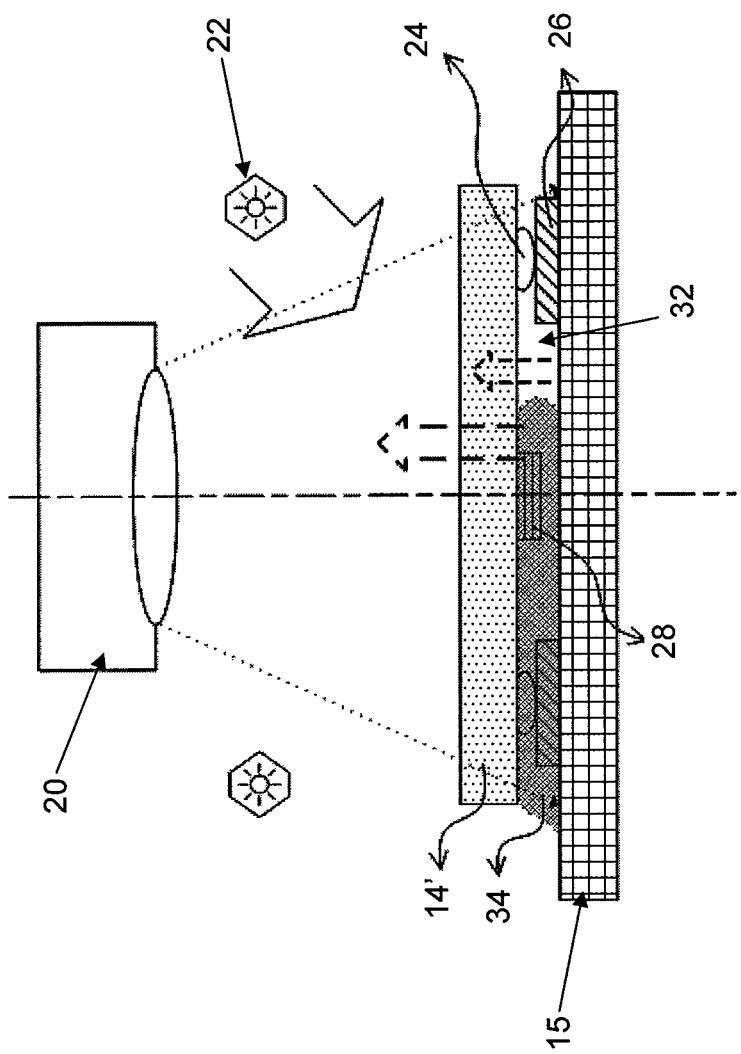
FIG. 7 is a schematic view of the second optical system of FIG. 5 illustrating post-bond inspection of the coverage of under-fill glue under a bonded flip-chip.

FIG. 7 is a schematic view of the second optical system 20 of FIG. 5 illustrating post-bond inspection of the coverage of under-fill glue 34 under a bonded flip-chip 14'. The set-up of the apparatus is similar to that used for post-bond inspection of integrated circuit or IC dice as illustrated in FIG. 6. The inclined IR lighting 22 is located above the flip-chip 14' and is used to illuminate the flip-chip 14' from its second or top side where there is no circuit pattern 28. Test dice are also used in this case for setting up the machine or for adjusting its parameters. Under this condition, the covering ratio of the metallic pattern on the flip-chip 14' surface is again relatively low and most of the IR light passes through the flip-chip 14'. The penetrated lighting reaches the level of the under-fill glue 34 which is not transparent to IR light. When there is a void 32 which is not covered by the glue, the different reflective responses between the under-fill glue 34 and any voids 32 result in different reflected light intensities and an image contrast. This contrast can be imaged and inspected by the second optical system 20 to determine the locations and sizes of voids 32 in the under-fill of the bonded flip-chip 14'.

It should be appreciated that using IR illumination, an image of a metallic pattern on a surface of a die can be obtained even though the pattern is hidden from view under visible light. The image pattern is useful for direct alignment and inspection purposes which are otherwise not possible as the pattern covered by the die is not viewable by a conventional optical system. Both the bonding accuracy in an integrated circuit die and a flip-chip and post-bond inspection accuracy can be significantly improved when compared with the conventional methods. Online inspection of the coverage of filling material underneath a bonded IC die or flip-chip die is therefore made possible by IR illumination.

The invention described herein is susceptible to variations, modifications and/or addition other than those specifically described and it is to be understood that the invention includes all such variations, modifications and/or additions which fall within the spirit and scope of the above description.

The invention claimed is:

1. A method of inspecting an alignment of a die relative to a substrate onto which it is placed during a die bonding process, the method comprising the steps of:

positioning the die such that a first side of the die which has a circuit pattern formed on it is facing away from an infrared light source, a portion of the first side of the die being covered by the circuit pattern;

projecting infrared light from the infrared light source onto a second side of the die opposite to the first side such that the infrared light passes through a body of the die;

from the second side of the die, detecting and capturing one or more images of the infrared light reflected from the circuit pattern and from predetermined patterns on the substrate; and thereafter determining an alignment of the die relative to the substrate by comparing the one or more captured images of the infrared light reflected from the circuit pattern with the one or more captured images of the infrared light reflected from the predetermined patterns on the substrate on which the die is placed, and calculating an offset between the die and the substrate.

2. The method as claimed in claim 1, wherein the step of positioning the die comprises a step of contacting the first side of the die with a pick head such that the circuit pattern is at least partially covered by the pick head, and generating a holding force on the first side of the die with the pick head.

3. The method as claimed in claim 2, wherein the pick head is made of a material which is non-reflective to infrared light.

4. The method as claimed in claim 1, wherein the second side of the die does not have any metallic material.

5. The method as claimed in claim 1, wherein the infrared light is projected at an oblique angle to the second side of the die.

6. The method as claimed in claim 1, wherein the step of determining an alignment of the die further comprises the step of calculating an alignment of the circuit pattern on the die relative to features on the substrate from a predetermined relationship between the said features and the circuit pattern on the die.

7. The method as claimed in claim 1, wherein the die is made from a material that is at least partially transparent to infrared light but is opaque to visible light.

8. The method as claimed in claim 1, wherein the circuit pattern is made from a material that is not transparent to infrared light, and reflects infrared light.

9. The method as claimed in claim 1, further comprising the step of obtaining an image of the substrate to determine the alignment of the substrate by detecting and capturing an image of light reflected from markings on the substrate.

10. The method as claimed in claim 9, wherein the step of obtaining the image of the substrate is performed simultaneously with the step of capturing one or more images of the infrared light reflected from the circuit pattern and from the predetermined patterns on the substrate.

\* \* \* \* \*